(12) United States Patent
Yamaguchi

(10) Patent No.: US 7,256,105 B2
(45) Date of Patent: Aug. 14, 2007

(54) SEMICONDUCTOR SUBSTRATE AND THIN PROCESSING METHOD FOR SEMICONDUCTOR SUBSTRATE

(75) Inventor: Koji Yamaguchi, Okinawa (JP)

(73) Assignee: Seiko Epson Corporation (JP)

( * ) Notice: Subject to any disclaimer, the term of this patent is extended or adjusted under 35 U.S.C. 154(b) by 142 days.

(21) Appl. No.: 11/120,108

(22) Filed: May 2, 2005

(65) Prior Publication Data

US 2005/0275092 A1 Dec. 15, 2005

(30) Foreign Application Priority Data

Jun. 9, 2004 (JP) .............................. 2004-171024

(51) Int. Cl.
*H01L 21/30* (2006.01)
*H01L 21/46* (2006.01)
(52) U.S. Cl. ................. 438/459; 438/692; 257/E21.237
(58) Field of Classification Search ................ 438/459, 438/690, 692, 959, 977; 257/E21.214, E21.237, 257/E21.304
See application file for complete search history.

(56) References Cited

U.S. PATENT DOCUMENTS 7,129,172 B2 * 10/2006 Morrow et al. ............. 438/690

FOREIGN PATENT DOCUMENTS

| JP | 07-045568 | 2/1995 |
|----|-----------|--------|
| JP | 2003-059878 | 2/2003 |

\* cited by examiner

*Primary Examiner*—Hoai Pham
(74) *Attorney, Agent, or Firm*—Harness, Dickey & Pierce, P.L.C.

(57) ABSTRACT

A semiconductor substrate having a first substrate surface which includes a device area in which semiconductor devices are formed and a substrate peripheral portion which does not overlap with the device area. A concavo-convex portion is formed in the substrate peripheral portion. Preferably, a concavo-convex portion is formed in a side portion which adjoins the peripheral portion. The concavo-convex portion formed in the substrate peripheral portion or the side portion may be formed by a method such as dry etching, wet etching, mechanical grinding, electrolytic plating, nonelectrolytic plating, or patterning using one of a resin material and a metal material. A thin processing method includes forming the device area; forming the concavo-convex portion in the substrate peripheral portion; adhering the first substrate surface to a support; and grinding a second substrate surface of the semiconductor substrate, which is opposite with the first substrate surface.

5 Claims, 5 Drawing Sheets

SEMICONDUCTOR SUBSTRATE AND THIN PROCESSING METHOD FOR SEMICONDUCTOR SUBSTRATE

BACKGROUND OF THE INVENTION

1. Field of the Invention

The present invention relates to a semiconductor substrate and a thin processing method for semiconductor substrates.

Priority is claimed on Japanese Patent Application No. 2004-171024, filed Jun. 9, 2004, the content of which is incorporated herein by reference.

2. Description of Related Art

Recently, in portable electronic devices such as cellular phones, notebook computers, and PDAs (personal digital assistants or personal data assistants), or other devices such as sensors, micromachines, and printer heads, various electronic parts such as semiconductor chips are miniaturized so as to reduce the size and the weight of the devices. In addition, spaces for mounting such electronic parts are extremely limited. Therefore, in methods for packaging semiconductor chips, ultra small packaging or high-density mounting has been investigated by using a CSP (chip scale package) technique or a W-CSP (wafer level chip scale package) technique.

When semiconductor chips are manufactured using the CSP or the W-CSP technique, the thickness of the semiconductor chip is reduced to approximately 70 μm so as to produce a small-size, light, and thin package. Specifically, after forming an electronic circuit on a wafer, the wafer is fixed to a support via an adhesive or the like, and the back face of the wafer, that is, the face on which no electronic circuit is formed, is subjected to grinding (i.e., back grinding), so as to reduce the thickness of the wafer.

However, such a process of reducing the thickness of the wafer tends to cause a crack which starts from a peripheral edge of the wafer. In an example of techniques for avoiding formation of such a crack, which have been developed, the end face of the wafer is ground so as to prevent the peripheral portion of the wafer from having an edge shape, and in another example, the end face of the wafer is ground so as to form a number of convex portions for preventing the peripheral portion of the wafer from having an edge shape (see Japanese Unexamined Patent Applications, First Publications Nos. 2003-059878 and H07-045568).

In the techniques described in the above publications, cracks generated in thin processing of the wafer can be reduced. However, the inventor of the present invention found that the efficiency for preventing cracks is insufficient.

SUMMARY OF THE INVENTION

In view of the above circumstances, an object of the present invention is to provide a semiconductor substrate and a thin processing method for semiconductor substrates, for reliably preventing formation of cracks of a wafer in thin processing of the wafer.

The inventor of the present invention found that in thin processing of the wafer, water, supplied for lubricating a grinding member and the wafer and for cooling both, enters between the wafer and the support (for the wafer), so that a peripheral portion of the wafer rises or swells, which produces a curvature by which the contact pressure between the grinding member and the wafer on the grinding face is made nonuniform, thereby causing a crack in the wafer.

Therefore, the inventor conceived of the present invention which provides a semiconductor substrate having a first substrate surface which includes a device area in which semiconductor devices are formed and a substrate peripheral portion which does not overlap with the device area, wherein a concavo-convex portion is formed in the substrate peripheral portion.

According to the formation of the concavo-convex portion, the surface area or the exposed area of the substrate peripheral portion is larger than that measured when no concavo-convex portion is formed. When the semiconductor substrate and a support for the substrate are adhered via an adhesive layer before the thin processing of the semiconductor substrate, the adhesive area between the adhesive layer and the substrate peripheral portion can be large, thereby improving adhesion between the adhesive layer and the semiconductor substrate and preventing the semiconductor substrate from separating from the support. Accordingly, it is possible to prevent water, supplied for lubricating or cooling the grinding member and the semiconductor substrate in thin processing of the semiconductor substrate, from entering into a gap between the semiconductor substrate and the support. Therefore, no peripheral portion of the semiconductor substrate swells, thereby preventing the semiconductor substrate from warping, and obtaining uniform contact pressure of a grinding member to the semiconductor substrate in a second substrate surface opposite with the first substrate surface. Accordingly, it is possible to prevent the semiconductor substrate from cracking, thereby improving the yield of the semiconductor substrate and reducing the manufacturing cost of the semiconductor substrate.

Preferably, a concavo-convex portion is formed in a side portion which adjoins the peripheral portion. Accordingly, the surface area or the exposed area of not only the substrate peripheral portion but also the side portion is larger than that measured when no concavo-convex portion is formed. In addition, when the semiconductor substrate and a support for the substrate are adhered via an adhesive layer, the adhesive layer is held or retained by the concavo-convex portion at the side portion, thereby further improving adhesion between the adhesive layer and the semiconductor substrate. According to the holding of the adhesive layer via the concavo-convex portion at the side portion, it is possible to more reliably prevent water from entering into a gap between the semiconductor substrate and the support. Therefore, it is possible to improve the barrier effect for water.

The concavo-convex portion formed in the substrate peripheral portion or the side portion may be formed by a method such as dry etching, wet etching, mechanical grinding, electrolytic plating, nonelectrolytic plating, or patterning using one of a resin material and a metal material.

According to the above known methods, it is possible to easily form the concavo-convex portion in the substrate peripheral portion or the side portion.

When employing dry etching, wet etching, or mechanical grinding, the concavo-convex portion can be formed by damaging a surface of the substrate peripheral portion or the side portion. When employing dry etching or wet etching, a fine concavo-convex portion can be formed by using a chemical function, that is, using plasma of a reactive gas or a reactant liquid functioning as an etchant.

When employing electrolytic plating, nonelectrolytic plating, or patterning using one of a resin material and a metal material, the concavo-convex portion can be formed by adding resin or metal portions to the substrate peripheral portion or the side portion. Additionally, in electrolytic plating or nonelectrolytic plating, the semiconductor substrate is impregnated with a plating solution, thereby partially depositing a metal material so as to form the concavo-convex portion. In patterning using one of a resin material and a metal material, the concavo-convex portion can be formed by forming a thin film of a photosensitive resin or a metal and removing portions of the thin film.

The present invention also provides a method for thin processing a semiconductor substrate, comprising:

forming a device area on a first substrate surface of the semiconductor substrate, wherein semiconductor devices are formed in the device area;

forming a concavo-convex portion in a substrate peripheral portion which does not overlap with the device area in the first substrate surface;

adhering the first substrate surface to a support; and grinding a second substrate surface of the semiconductor substrate, which is opposite with the first substrate surface.

According to the formation process of the concavo-convex portion, the surface area or the exposed area of the substrate peripheral portion is larger than that measured when no concavo-convex portion is formed. In addition, according to the adhering process of the first substrate surface to the support, the semiconductor substrate and the support are adhered via an adhesive layer, so that the adhesive area between the adhesive layer and the substrate peripheral portion can be large, thereby improving adhesion between the adhesive layer and the semiconductor substrate and preventing the semiconductor substrate from separating from the support. Accordingly, it is possible to prevent water, supplied for lubricating or cooling the grinding member and the semiconductor substrate in thin processing of the semiconductor substrate, from entering into a gap between the semiconductor substrate and the support. Additionally, according to the grinding process of the second substrate surface, the semiconductor substrate can be thin-processed. As explained above, water does not enter into a gap between the semiconductor substrate and the support. Therefore, no peripheral portion of the semiconductor substrate swells, thereby preventing the semiconductor substrate from warping, and obtaining uniform contact pressure of a grinding member to the semiconductor substrate in the second substrate surface. Accordingly, it is possible to prevent the semiconductor substrate from cracking, thereby improving the yield of the semiconductor substrate and reducing the manufacturing cost of the semiconductor substrate.

Typically, the adhering of the first substrate surface includes adhering the first substrate surface via an adhesive layer. Accordingly, it is possible to reliably adhere the semiconductor substrate to the support. In addition, the adhesive layer is supported by the concavo-convex portion formed in the substrate peripheral portion and thus the adhesive area between the adhesive layer and the substrate peripheral portion is large, thereby obtaining effects as explained above.

The adhesive layer may be in a fluid state. When such an adhesive layer may in the fluid state is provided between the semiconductor substrate and the support, the adhesive layer spreads over the entire space between the semiconductor substrate and the support, thereby obtaining a large adhesive area and improving adhesive strength.

Typically, the grinding of the second substrate surface is performed by back grinding. In this case, the semiconductor substrate can be thin-processed by subjecting the second substrate surface to back grinding.

The method may further comprise reducing a diameter of the semiconductor substrate by grinding a side portion of the semiconductor substrate device area, so that the diameter of the semiconductor substrate is less than a diameter of the support.

when the diameter of the semiconductor substrate is larger than the diameter of the support, an end face of the semiconductor substrate projects and functions as a free end. In this case, the semiconductor substrate tends to separate from the support, that is, adhesion between the support and the semiconductor substrate is degraded. When the diameter of the semiconductor substrate is almost the same as the diameter of the support, if there is a slight position gap between the support and the semiconductor substrate, an end face of the semiconductor substrate projects and functions as a free end, thereby degrading adhesion as explained above. Therefore, when the diameter of the semiconductor substrate is less than the diameter of the support, the semiconductor substrate is reliably installed on the support, thereby stably supporting the semiconductor substrate on the support and preventing the semiconductor substrate from separating from the support.

BRIEF DESCRIPTION OF THE DRAWINGS

FIGS. 1A and 1B are respectively a plan view and a sectional view of the semiconductor substrate, and FIG. 1C is an enlarged view of the area indicated by reference symbol A in FIG. 1B.

DETAILED DESCRIPTION OF THE INVENTION

Figure 1A:
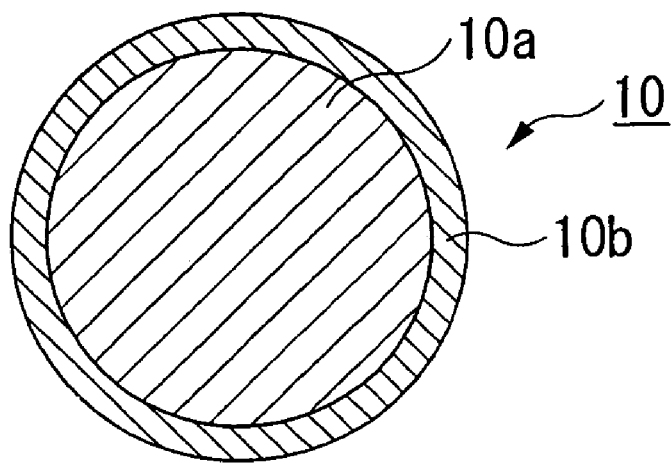
FIGS. 1A to 1C are diagrams showing an example of the semiconductor substrate in embodiments of the present invention.

Hereinafter, embodiments according to the present invention, as best modes for implementing the present invention, will be explained with reference to the drawings. In the drawings, the scale is not uniform so that each element and layer can be easily recognized and understood.

Figure 1B:
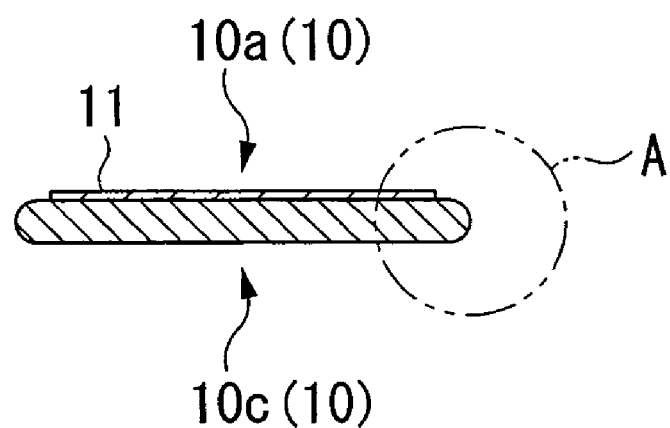
Figure 1C:
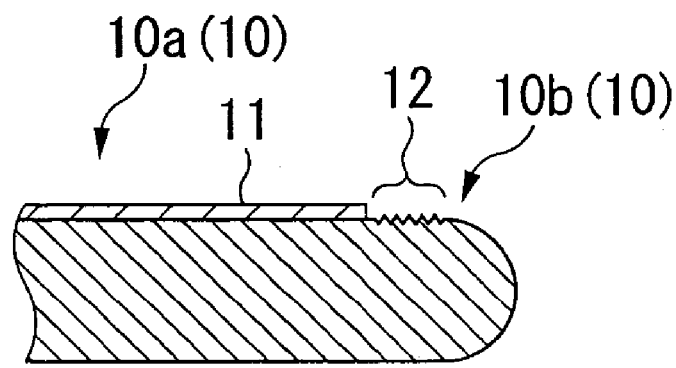

FIGS. 1A to 1C are diagrams showing an example of the semiconductor substrate. FIGS. 1A and 1B are respectively a plan view and a sectional view of the semiconductor substrate, and FIG. 1C is an enlarged view of the area indicated by reference symbol A in FIG. 1B.

As shown in the figures, on a surface 10a (i.e., the first substrate surface) of the semiconductor substrate 10, a device area 11 is provided, in which semiconductor devices such as integrated circuits are formed. In a peripheral portion 10b of the semiconductor substrate 10 (i.e., a substrate peripheral portion), that is, an area other than the device area 11 on the surface 10a, a concavo-convex portion 12 is formed.

The semiconductor substrate 10 is, for example, a substrate made of Si (silicon), that is, a silicon wafer. The size of the silicon wafer is approximately 8 to 12 inches.

In the device area 11, an electronic circuit including transistors, memory devices, other electronic devices, and electric wiring is formed for each semiconductor chip.

The concavo-convex portion 12 formed in the peripheral portion 10b can be formed by various methods explained later. The concavo-convex portion 12 can be obtained by providing fine concave portions on the surface of the peripheral portion 10b, or by providing fine convex portions made of metal, resin, or the like on the surface of the peripheral portion 10b, so as to produce a relatively concavo-convex form.

The back face 10c of the semiconductor substrate 10 (i.e., the second substrate surface) is a face ground in thin processing as explained later. No semiconductor device such as an integrated circuit is formed on the back face 10c.

The semiconductor substrate shown in FIG. 1A has a circular shape; however, a cut portion, that is, an orientation flat is actually formed in a portion of the circumference of the circle.

FIRST EMBODIMENT OF THIN PROCESSING METHOD OF SEMICONDUCTOR SUBSTRATE

Below, the method for thin-processing the semiconductor substrate 10 will be explained as the first embodiment of the thin processing method of the semiconductor substrate according to the present invention.

Figure 2A:
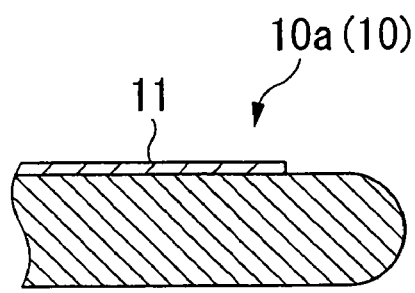
FIGS. 2A to 2D are diagrams showing the processes of performing thin processing of the semiconductor substrate in the first embodiment of the present invention.
Figure 2B:
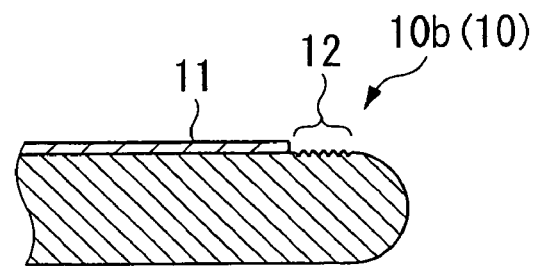
Figure 2C:
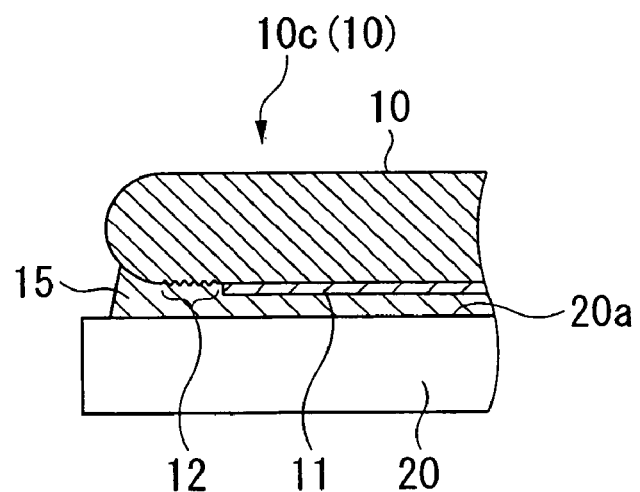

FIGS. 2A to 2D are diagrams showing the processes of performing thin processing of the semiconductor substrate 10. Each figure is an enlarged view of the area indicated by the reference symbol A in FIG. 1B. FIG. 2C shows a view obtained by inverting the semiconductor substrate 10 shown in FIG. 2B, and a support to which the semiconductor substrate 10 is adhered is also shown in FIG. 2C.

First, as shown in FIG. 2A, the device area 11 is formed on the surface 10a of the semiconductor substrate 10. Here, the device area 11 is formed in the area other than the peripheral portion 10b. As explained above, the device area 11 is an area for an electronic circuit which includes transistors, memory devices, other electronic devices, electric wiring, and the like, which are formed by known processes such as photolithography, oxidation, film-formation, doping, etching, and the like.

In the next process, as shown in FIG. 2B, a concavo-convex portion 12 is formed in the peripheral portion 10b. The concavo-convex portion 12 can be formed by dry etching, wet etching, mechanical grinding, electrolytic plating, nonelectrolytic plating, patterning using a resin or metal material, or the like. When employing dry etching, wet etching, or mechanical grinding, the surface of the peripheral portion 10b of the semiconductor substrate 10 is damaged so as to form the concavo-convex portion 12. In other words, fine concave portions are formed so as to form a relatively concavo-convex form. When employing electrolytic plating, nonelectrolytic plating, patterning using a resin or metal material, fine convex portions made of metal or resin are provided on the surface of the peripheral portion 10b of the semiconductor substrate 10 so as to form the concavo-convex portion 12. In other words, fine convex portions are formed so as to form a relatively concavo-convex form. Each method will be further explained below.

When employing dry etching, plasma of a reactive gas is generated in a chamber in which the semiconductor substrate 10 is contained. In this process, the peripheral portion 10b of the semiconductor substrate 10 is exposed while the device area 11 is covered with a mask such as a resin film or the like. The reactive gas is a gas suitable for etching a silicon material, for example, a fluoride gas such as $SF_6$ or $CF_4$. The surface of the exposed peripheral portion 10b is damaged by such dry etching, thereby forming the concavo-convex portion 12.

When employing wet etching, the semiconductor substrate 10 is impregnated with an etchant for a specific period of time. Here, only the peripheral portion 10b of the semiconductor substrate 10 is exposed in this process. The etchant is an reactant liquid suitable for etching a silicon material, for example, hydrofluoric acid. The surface of the exposed peripheral portion 10b is damaged by such wet etching, thereby forming the concavo-convex portion 12.

When employing mechanical grinding, while a grinding member contacts the peripheral portion 10b of the semiconductor substrate 10, the grinding member and the semiconductor substrate 10 are relatively moved in a peripheral direction of the semiconductor substrate 10. Here, the grinding member has an appropriate tooth shape selected so as to produce the concavo-convex portion 12 having a desired form. Preferably, in such grinding, the device area 11 is masked so as to protect the area. The surface of the exposed peripheral portion 10b is damaged by such mechanical grinding, thereby forming the concavo-convex portion 12.

When employing electrolytic plating, the semiconductor substrate 10 is impregnated with a plating solution and a voltage is applied between a terminal connected to the semiconductor substrate 10 and an electrode provided in a vessel of the plating solution. In this process, it is necessary to form a seed layer in the peripheral portion 10b in advance, thereby forming a plating layer only in the area where the seed layer has been formed. Here, semiconductor devices or the like are formed in the device area 11; thus, it is preferable that the device area 11 be masked so as to prevent the area from contacting the plating solution. In such electrolytic plating, metal ions included in the plating solution are attracted toward the seed layer and deposit, so that convex portions are partially formed on the peripheral portion 10b, thereby forming a relatively concavo-convex form.

When employing patterning using a resin or metal material, a known photolithography technique is used. For example, when performing patterning of a resin material, the peripheral portion 10b is uniformly coated with a resin film and the resin film is further coated with a photoresist. According to a succeeding exposing and developing process, holes are formed in the photoresist, and then portions of the resin film, which are exposed through the holes, are removed, thereby performing the patterning of the resin material. Similar patterning can be performed when a metal material is used instead of a resin material. When a photosensitive resin is used as the resin material, patterning can be applied to the resin material itself, thereby simplified the process. According to the patterning as explained above, convex portions can be partially formed in the peripheral portion 10b, thereby forming a relatively concavo-convex form.

In the next process (see FIG. 2C), the semiconductor substrate 10 is inverted and a stage 20 (i.e., a support) and the semiconductor substrate 10 are adhered to each other.

The stage 20 may be a glass substrate, a metal substrate, a resin substrate, or the like, and has a precisely flat surface 20a provided for preventing the semiconductor substrate 10 from bending. The semiconductor substrate 10 is adhered to the stage 20 in a manner such that the flat surface 20a faces the device area 11. In addition, an adhesive layer 15 is provided between the semiconductor substrate 10 and the stage 20. The adhesive layer 15 is formed by an adhesive agent, an adhesive tape, an adhesive sheet, or the like. Preferably, the adhesive layer 15 is in a fluid state. In this case, when the stage 20 and the semiconductor substrate 10 are adhered to each other, the liquid and wet adhesive layer 15 spreads over the entire area of the surface 10a, so that air bubbles cannot easily enter the portion between the stage 20 and the semiconductor substrate 10 and the semiconductor substrate 10 can be evenly adhered to the stage 20. In addition, the entire space between the stage 20 and the semiconductor substrate 10 can be filled with the liquid adhesive layer 15, which produces a wide adhesive area and improves the adhesive strength.

Preferably, the adhesive layer 15 is a heat-reactive resin or an ultraviolet-reactive resin. Accordingly, after the semiconductor substrate 10 and the stage 20 are adhered via the adhesive layer 15, both can be reliably adhered by heating the adhesive layer 15 or irradiating the adhesive layer 15 with an ultraviolet ray.

Figure 2D:
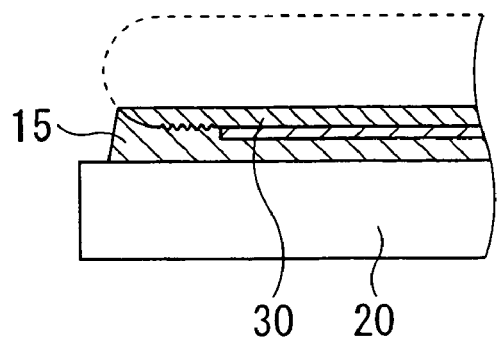

In the next process (see FIG. 2D), the back face 10c of the semiconductor substrate 10 is subjected to back grinding, so as to thin-process the semiconductor substrate 10. Specifically, a grinding member is made to contact with the back face 10c, and the back face 10c is ground while relatively moving the grinding member and the semiconductor substrate 10. During this process of back grinding, water for cooling and lubricating the grinding member and the semiconductor substrate 10 is supplied. According to the back grinding, the portion indicated by dotted line in FIG. 2D is removed, thereby producing a thin substrate 30. The thin substrate 30 is further subjected to spin etching or dry etching, thereby finishing the substrate in thin processing.

As explained above, in the present embodiment, a concavo-convex portion is formed in the peripheral portion 10b; thus, the surface area or the exposed area of the peripheral portion 10b is larger than that measured when no concavo-convex portion is formed. In addition, when the semiconductor substrate 10 and the stage 20 are adhered via the adhesive layer 15 before the thin processing of the semiconductor substrate 10, the adhesive area between the adhesive layer 15 and the peripheral portion 10b can be large, thereby improving adhesion between the adhesive layer 15 and the semiconductor substrate 10 and preventing the semiconductor substrate 10 from separating from the stage 20. Accordingly, it is possible to prevent water, supplied for lubricating or cooling the grinding member and the semiconductor substrate 10, from entering into a gap between the semiconductor substrate 10 and the stage 20. Therefore, no peripheral portion of the semiconductor substrate 10 swells, thereby preventing the semiconductor substrate 10 from warping, and obtaining uniform contact pressure of the grinding member to the semiconductor substrate 10 in the back face 10c. Accordingly, it is possible to prevent the semiconductor substrate 10 from cracking, thereby improving the yield of the semiconductor substrate 10 and reducing the manufacturing cost of the semiconductor substrate 10.

In addition, the concavo-convex portion 12 is formed by dry etching, wet etching, mechanical grinding, electrolytic plating, nonelectrolytic plating, patterning using a resin or metal material, or the like. Therefore, it is possible to easily form the concavo-convex portion 12 in the peripheral portion 10b.

SECOND EMBODIMENT OF THIN PROCESSING OF SEMICONDUCTOR SUBSTRATE

Figure 3A:
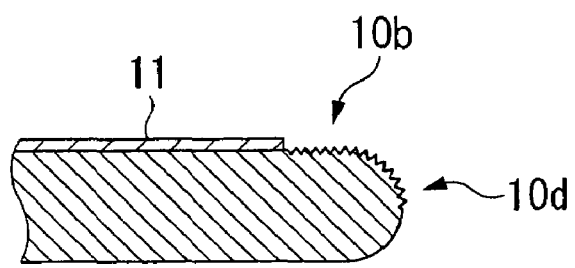
FIGS. 3A to 3C are diagrams showing the processes of performing thin processing of the semiconductor substrate in the second embodiment of the present invention.

Below, the second embodiment of thin processing of the semiconductor substrate will be explained by referring to FIGS. 3A to 4. FIGS. 3A to 3C are diagrams showing the processes in thin processing, and FIG. 4 is a diagram showing a grinding member which can be used in the process shown in FIG. 3A.

In this embodiment, parts having structures identical to those in the previous embodiment are given identical reference numerals and explanations thereof are simplified. In addition, processes identical to those in the previous embodiment are simply explained by referring to corresponding diagrams.

First, as shown in FIG. 2A, the semiconductor substrate 10, on which the device area 11 is formed, is prepared for processing. Next, as shown in FIG. 3A, a concavo-convex portion 12 is formed from the peripheral portion 10b to a side portion 10d. In order to form the concavo-convex portion 12, similar methods in the first embodiment can be used. When employing dry etching, wet etching, electrolytic plating, or nonelectrolytic plating, not only the peripheral portion 10b but also the side portion 10d are exposed, and the concavo-convex portion 12 is formed in the exposed area.

Figure 4:
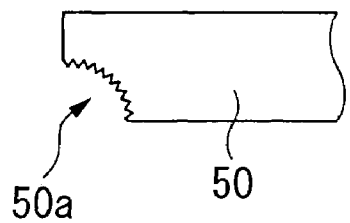
FIG. 4 is a diagram showing a grinding member used in the second embodiment.

When forming the concavo-convex portion 12 by mechanical grinding, a grinding member as shown in FIG. 4 is used. The grinding member 50 in FIG. 4 has teeth 50a, arranged along a curved line, for simultaneously grinding the peripheral portion 10b and the side portion 10d of the semiconductor substrate 10. Grinding is performed by making such a grinding member 50 contact the peripheral portion 10b and the side portion 10d of the semiconductor substrate 10, thereby forming the concavo-convex portion 12 from the peripheral portion 10b to the side portion 10d.

Figure 3B:
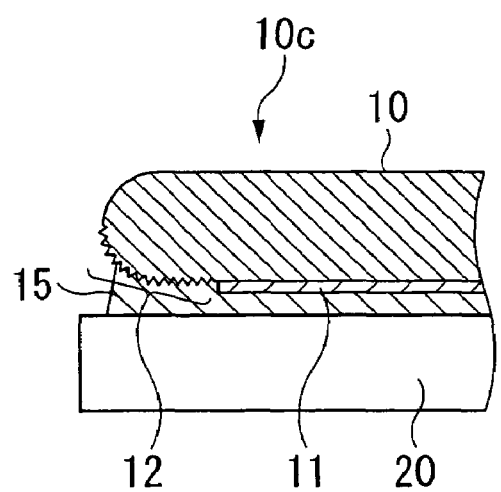
Figure 3C:
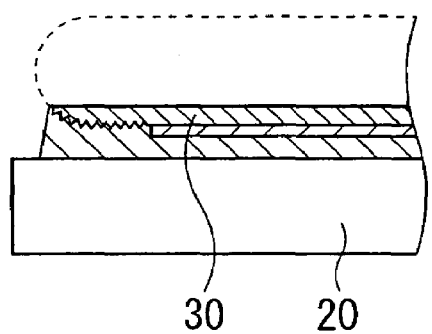

In the next step, as shown in FIG. 3B, after the semiconductor substrate 10 is inverted, the stage 20 and the semiconductor substrate 10 are adhered via the adhesive layer 15. Preferably, the adhesive layer 15 is in a fluid state. In this case, the liquid and wet adhesive layer 15 spreads over the side portion 10d.

In the next process (see FIG. 3C), the back face 10c of the semiconductor substrate 10 is subjected to back grinding, so as to thin-process the semiconductor substrate 10. During this process of back grinding, water for cooling and lubricating the grinding member and the semiconductor substrate 10 is supplied. According to back grinding, the portion indicated by dotted line in FIG. 3C is removed, thereby producing a thin substrate 30. The thin substrate 30 is further subjected to spin etching or dry etching, thereby finishing the substrate in thin processing.

As explained above, in the present embodiment, a concavo-convex portion is formed also in the side portion 10d which adjoins the peripheral portion 10. Therefore, the surface area or the exposed area of not only the peripheral portion 10b but also the side portion 10d is larger than that measured when no concavo-convex portion is formed. In addition, when the semiconductor substrate 10 and the stage 20 are adhered via the adhesive layer 15, the adhesive layer 15 is held or retained by the concavo-convex portion 12 at the side portion 10d, thereby further improving adhesion between the adhesive layer 15 and the semiconductor substrate 10. According to the holding of the adhesive layer 15 via the concavo-convex portion at the side portion 10d, it is possible to more reliably prevent water from entering into a gap between the semiconductor substrate 10 and the stage 20. Therefore, it is possible to improve the barrier effect for water.

THIRD EMBODIMENT OF THIN PROCESSING OF SEMICONDUCTOR SUBSTRATE

Figure 5A:
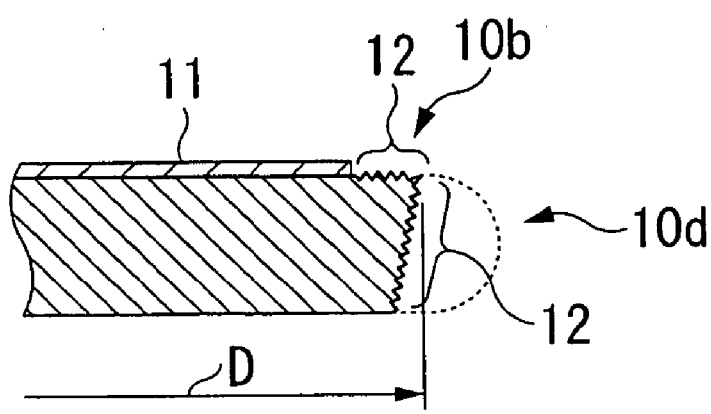
FIGS. 5A to 5C are diagrams showing the processes of performing thin processing of the semiconductor substrate in the third embodiment of the present invention.

Below, the third embodiment of thin processing of the semiconductor substrate will be explained by referring to FIGS. 5A to 5C, which are diagrams showing the processes in thin processing of a semiconductor substrate.

In this embodiment, parts having structures identical to those in the previous embodiments are given identical reference numerals and explanations thereof are simplified. In addition, processes identical to those in the previous embodiments are simply explained by referring to corresponding diagrams.

First, as shown in FIG. 2A, the semiconductor substrate 10, on which the device area 11 is formed, is prepared for processing. Next, as shown in FIG. 5A, a concavo-convex portion 12 is formed from the peripheral portion 10b to a side portion 10d. In order to form the concavo-convex portion 12, similar methods in the previous embodiments can be used. When employing dry etching, wet etching, electrolytic plating, or nonelectrolytic plating, not only the peripheral portion 10b but also the side portion 10d are exposed, and the concavo-convex portion 12 is formed in the exposed area.

In this embodiment, the side portion 10d of the semiconductor substrate 10 is ground so as to reduce the original diameter of the semiconductor substrate 10, that is, produce the semiconductor substrate 10 having a reduced diameter D. Preferably, the side portion 10d is mechanically ground while a grinding member contacts the side portion 10d. In addition, the diameter D of the semiconductor substrate 10 is less than diameter D1 of stage 20.

Figure 5B:
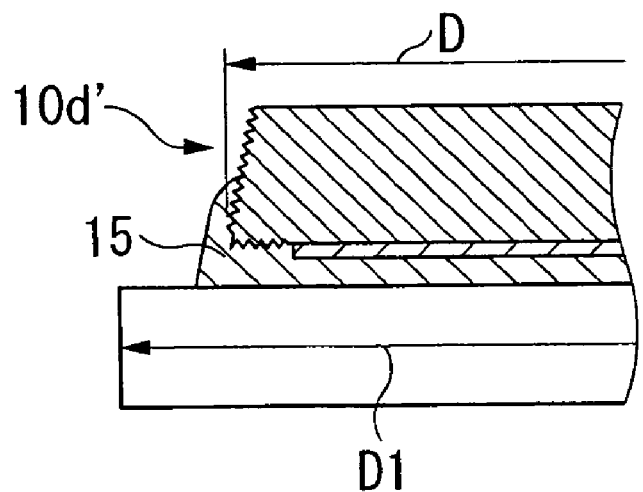
Figure 5C:
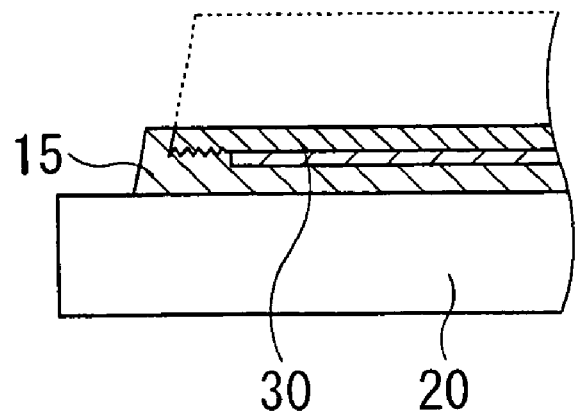

In the next step, as shown in FIG. 5B, after the semiconductor substrate 10 is inverted, the stage 20 and the semiconductor substrate 10 are adhered via the adhesive layer 15. Preferably, the adhesive layer 15 is in a fluid state. In this case, the liquid and wet adhesive layer 15 spreads over the side portion 10d'. In addition, when comparing the diameter D of the semiconductor substrate 10, which was reduced by grinding the side portion 10d, with the diameter D1 of the stage 20, D1 is larger than D; thus, the semiconductor substrate 10 is stably supported on the stage 20.

In the next process (see FIG. 5C), the back face 10c of the semiconductor substrate 10 is subjected to back grinding, so as to thin-process the semiconductor substrate 10. During this process of back grinding, water for cooling and lubricating the grinding member and the semiconductor substrate 10 is supplied. According to the back grinding, the portion indicated by dotted line in FIG. 5C is removed, thereby producing a thin substrate 30. The thin substrate 30 is further subjected to spin etching or dry etching, thereby finishing the substrate in thin processing.

As explained above, in the present embodiment, the side portion 10d of the semiconductor substrate 10 is ground so as to reduce the diameter D of the semiconductor substrate 10 in comparison with the diameter D1 of the stage 20, so that the semiconductor substrate 10 is reliably installed and stably supported on the stage 20. More specifically, when the diameter D of the semiconductor substrate 10 is larger than the diameter D1 of the stage 20, the side portion 10d (i.e., the end face) projects and functions as a free end. In this case, the semiconductor substrate 10 tends to separate from the stage 20, that is, adhesion between the stage 20 and the semiconductor substrate 10 is degraded. When the diameter D of the semiconductor substrate 10 is almost the same as the diameter D1 of the stage 20, if there is a slight position gap between the stage 20 and the semiconductor substrate 10, a side portion 10d (i.e., an end face) of the semiconductor substrate 10 projects and functions as a free end, thereby degrading adhesion as explained above. Therefore, when the diameter D of the semiconductor substrate 10 is less than the diameter D1 of the stage 20, the side portion 10d' of the semiconductor substrate 10 is reliably installed on the stage 20 and no free end is produced, thereby preventing the semiconductor substrate 10 from separating from the stage 20.

FOURTH EMBODIMENT OF THIN PROCESSING OF SEMICONDUCTOR SUBSTRATE

Figure 6A:
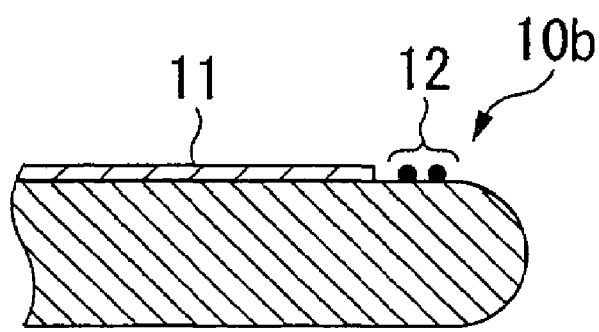
FIGS. 6A to 6C are diagrams showing the processes of performing thin processing of the semiconductor substrate in the fourth embodiment of the present invention.

Below, the fourth embodiment of thin processing of the semiconductor substrate will be explained by referring to FIGS. 6A to 6C, which are diagrams showing the processes in thin processing of a semiconductor substrate.

In this embodiment, parts having structures identical to those in the previous embodiments are given identical reference numerals and explanations thereof are simplified. In addition, processes identical to those in the previous embodiments are simply explained by referring to corresponding diagrams.

First, as shown in FIG. 2A, the semiconductor substrate 10, on which the device area 11 is formed, is prepared for processing. Next, as shown in FIG. 6A, a concavo-convex portion 12 is formed in the peripheral portion 10b. Specifically, the concavo-convex portion 12 is formed by electrolytic plating, nonelectrolytic plating, or patterning using a resin or metal material, or the like, without using dry etching or wet etching. In this case, different from the case employing etching, convex portions are provided on the surface of the peripheral portion 10b so as to form a relatively concavo-convex form.

Figure 6B:
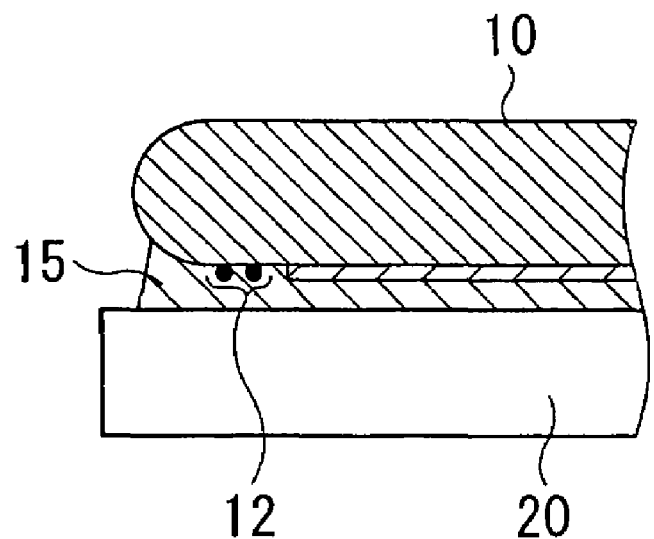
Figure 6C:
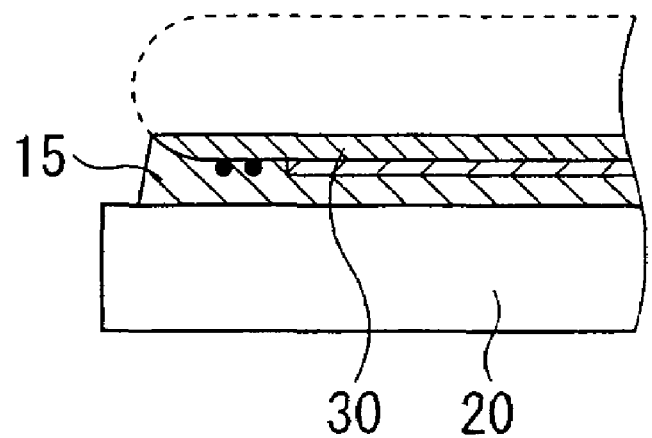

In the next step, as shown in FIG. 6B, after the semiconductor substrate 10 is inverted, the stage 20 and the semiconductor substrate 10 are adhered via the adhesive layer 15. Preferably, the adhesive layer 15 is in a fluid state. In this case, the liquid and wet adhesive layer 15 spreads over the entire surface of the semiconductor substrate 10.

In the next process (see FIG. 6C), the back face 10c of the semiconductor substrate 10 is subjected to back grinding, so as to thin-process the semiconductor substrate 10. During this process of back grinding, water for cooling and lubricating the grinding member and the semiconductor substrate 10 is supplied. According to back grinding, the portion indicated by dotted line in FIG. 6C is removed, thereby producing a thin substrate 30. The thin substrate 30 is further subjected to spin etching or dry etching, thereby finishing the substrate in thin processing.

As explained above, in the present embodiment, a concavo-convex portion 12 is formed in the peripheral portion 10b; thus, the surface area or the exposed area of the peripheral portion 10b is larger. In addition, when the semiconductor substrate 10 and the stage 20 are adhered via the adhesive layer 15, adhesive strength between the semiconductor substrate 10 and the stage 20 is improved. Accordingly, it is possible to prevent water from entering into a gap between the semiconductor substrate 10 and the stage 20. Therefore, it is possible to prevent the semiconductor substrate 10 from separating from the stage or having a crack.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for thin processing a semiconductor substrate, comprising:
    forming a device area on a first substrate surface of the semiconductor substrate, wherein semiconductor devices are formed in the device area;
    forming a concavo-convex portion in a substrate peripheral portion which does not overlap with the device area in the first substrate surface;
    adhering the first substrate surface to a support; and
    grinding a second substrate surface of the semiconductor substrate, which is opposite with the first substrate surface.

2. A method as claimed in claim 1, wherein the adhering of the first substrate surface includes adhering the first substrate surface via an adhesive layer.

3. A method as claimed in claim 2, wherein the adhesive layer is in a fluid state.

4. A method as claimed in claim 1, wherein the grinding of the second substrate surface is performed by back grinding.

5. A method as claimed in claim 1, further comprising:
    reducing a diameter of the semiconductor substrate by grinding a side portion of the semiconductor substrate device area, so that the diameter of the semiconductor substrate is less than a diameter of the support.

* * * * *